US010497601B2

(12) United States Patent
Burggraf

(10) Patent No.: US 10,497,601 B2
(45) Date of Patent: Dec. 3, 2019

(54) DEVICE AND METHOD FOR COATING OF A CARRIER WAFER

(75) Inventor: Jürgen Burggraf, Schärding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 785 days.

(21) Appl. No.: 14/345,733

(22) PCT Filed: Sep. 20, 2011

(86) PCT No.: PCT/EP2011/066345

§ 371 (c)(1),
(2), (4) Date: Apr. 2, 2014

(87) PCT Pub. No.: WO2013/041129

PCT Pub. Date: Mar. 28, 2013

(65) Prior Publication Data

US 2014/0227440 A1 Aug. 14, 2014

(51) Int. Cl.

*H01L 21/683* (2006.01)
*B05C 11/02* (2006.01)
*H01L 21/67* (2006.01)

(52) U.S. Cl.

CPC .......... *H01L 21/6835* (2013.01); *B05C 11/02* (2013.01); *H01L 21/6715* (2013.01); *H01L 21/67051* (2013.01)

(58) Field of Classification Search

USPC ... 118/52, 56, 612, 319, 320, 686, 692, 698; 134/198, 153, 902; 396/604, 611, 627
See application file for complete search history.

(56) References Cited

U.S. PATENT DOCUMENTS 5,705,223 A * 1/1998 Bunkofske .......... H01L 21/6715 118/52
5,952,050 A * 9/1999 Doan .................... B05D 1/005 118/52
6,033,589 A 3/2000 Lin ................................ 216/92
(Continued)

FOREIGN PATENT DOCUMENTS

JP S6240458 A 2/1987 ............... G03F 1/00
JP WO 2008142923 A1 * 11/2008 ......... H01L 21/6715
(Continued)

OTHER PUBLICATIONS

English Translation WO 2008/142923A1, Nov. 2008.*
(Continued)

*Primary Examiner* — Yewebdar T Tadesse
(74) *Attorney, Agent, or Firm* — Kusner & Jaffe

(57) ABSTRACT

A device and corresponding method for coating of an inner circular surface of a coating surface of a carrier wafer with a coating material. The device includes an application means for applying a coating material intended for coating of the inner circular surface to the inner circular surface, a rotating means for accommodating and rotating the carrier wafer around an axis of rotation and for distribution of the coating material on the coating surface, and a second application means for applying a coating inhibitor to an outer circular ring surface which surrounds the inner circular surface, said coating inhibitor at least inhibits the coating of the outer circular ring surface during the distribution of the coating material.

5 Claims, 1 Drawing Sheet

(56) References Cited

U.S. PATENT DOCUMENTS

| | | | | |
|---|---|---|---|---|
| 6,319,317 | B1 * | 11/2001 | Takamori | G03F 7/162 118/321 |
| 2007/0082134 | A1 | 4/2007 | Fukuda et al. | 427/337 |
| 2009/0269936 | A1 | 10/2009 | Tamada et al. | 438/758 |
| 2010/0155988 | A1 * | 6/2010 | Keil | B29C 33/3857 264/219 |

FOREIGN PATENT DOCUMENTS

| | | | |
|---|---|---|---|
| JP | 2011-510518 A | 3/2011 | H01L 21/02 |
| WO | WO 2008/142923 | 11/2008 | H01L 21/027 |
| WO | WO 2009/094558 | 7/2009 | H01L 23/12 |

OTHER PUBLICATIONS

Office Action issued in connection withJapanese Patent Application No. JP 2014-531110.

International Search Report for International Application No. PCT/EP2011/066345, dated Apr. 17, 2012.

Office Action (dated Apr. 9, 2015) issued in connection with European Patent Application No. 11 760 472.8.

* cited by examiner

DEVICE AND METHOD FOR COATING OF A CARRIER WAFER

FIELD OF THE INVENTION

This invention relates to a device and a method for coating of an inner circular surface of a coating surface of a carrier wafer with a coating material.

BACKGROUND OF THE INVENTION

In semiconductor technology, methods for temporary bonding are playing a more and more important part to be able to optimally handle structure wafers which are becoming thinner and larger in area. The handling of structure wafers in the prior art has been especially improved by only one part of the structure wafer being temporarily bonded to the carrier wafer, preferably a peripheral edge. In this way contact of adhesive with the structured side of the structure wafer is avoided as much as possible. This is achieved in the prior art by only one edge zone of the coating surface of the carrier wafer being made adhesive, in particular by an inner circular surface of the wafer being coated with a coating material which reduces the adhesive force. A nonadhesive coating material is preferably, but not restrictively, an Anti Sticking Layer Material (ASL) such as for example Easy-Clean Coat 1000 from 3M.

The prior art has instantaneously following steps for production. First the edge zone B of a carrier wafer is coated with a resist, for example a photoresist. The photoresist is cured in a furnace or on a heating plate. Afterwards an ASL is applied over the entire surface. The ASL material cannot reach the surface of the carrier wafer which has been covered by the photoresist. After a certain action time in which a molecular layer has formed on the central region of the carrier wafer which is not covered with the photoresist, the remaining ASL material is spun off. Afterwards the photoresist is removed, for example with acetone. At this time the carrier wafer consists of two zones, one edge zone without ASL coating and a core zone with ASL coating. Afterwards an adhesive is applied on the entire carrier wafer. The adhesive adheres very well to the edge zone which has not been covered with ASL material. The adhesive strength of the adhesive in the core zone which has been coated with ASL material is very low. The cement is used in this core zone mainly to support structures of the structure wafer which is to be bonded later to the carrier wafer. It is clearly apparent from the prior art that several steps are required for producing the two zones. First, the application of the photoresist, second the curing of the photoresist, third the application of the ASL material, fourth the removal of the photoresist, and fifth the application of the adhesive.

The application of the coating and of the adhesive to the carrier wafer will take place as economically and quickly as possible, but at the same time in high quality, therefore especially a layer thickness as uniform as possible.

SUMMARY OF THE INVENTION

The object of this invention is therefore to optimize a device and a method for coating of a carrier wafer such that application can take place quickly and economically, but at the same time with high quality.

This object is achieved with the features of the independent claim(s). Advantageous developments of the invention are given in the dependent claims. All combinations of at least two of the features given in the specification, the claims and/or the figures also fall within the framework of the invention. At the given value ranges, values within the indicated limits will also be considered to be disclosed as boundary values and will be claimed in any combination.

The basic idea of this invention is to provide the coating of the carrier wafer with a coating material in different zones of the coating surface of the carrier wafer at least largely at the same time with inhibition, preferably prevention of the coating with the coating material in the zones (especially consisting of an inner circular surface and a preferably surrounding outer circular ring surface which encompasses the inner circular surface) of the coating surface in which coating is not to take place (outer circular ring surface). The coating material can be especially an antiadhesion material which as much as possible prevents the adhesion of the structure wafer or an applied adhesive on the carrier wafer in the region in which the coating material has been applied on the coating surface of the carrier wafer. The coating surface of the carrier wafer is generally one flat side of the carrier wafer on which the structure wafer is accommodated with its structure side, especially over the entire surface, preferably with a largely identical surface and surface contour. Structure wafers can also be wafers with two structure sides. Since the application of the coating material advantageously takes place concentrically to the carrier wafer, the coating material is advantageously applied during rotation of the carrier wafer and by rotation of the carrier wafer is uniformly and homogeneously distributed on it. By predominantly at the same time a solvent which dissolves the coating material being applied in regions of the structure wafer which are not to be coated, especially the adhesion zone, a coating of the coating surface with coating material in this region is at least largely, especially completely avoided. The coating of the edge zone (especially the outer circular ring surface) can also be prevented by the coating agent moving away over the solvent on the edge. In another embodiment it can be any liquid which need not necessarily be a solvent, over which the coating material can move away. These aforementioned agents inhibit or prevent, especially completely, the coating in the region where they are applied (outer circular ring surface). They are therefore called coating inhibitors here.

After curing of the coating material in the region of the coating surface to be coated and removal of the coating inhibitor, especially by rotation of the carrier wafer, or by evaporation, there is a carrier wafer with an only partially coated coating surface which can be produced in a continuous and single-stage process as claimed in the invention. In the uncoated region subsequently, especially by means of the second application means for applying the solvent, adhesive can be applied in the uncoated region of the coating surface and distributed. The adhesive can, as already known in the prior art, also be applied in a blanket manner, over the entire substrate, its covering the regions with low adhesive strength and high adhesive strength equally. Thus as claimed in the invention a carrier wafer can be produced with a coating surface which has several zones for accommodating a structure wafer in a two-stage production method as claimed in the invention. Coating inhibitors and coating material are preferably applied at the same time. The activation sequence calls for the solvent to be applied preferably at latest until the coating material is reached, more preferably at the same time with the coating material, most preferably prior to the coating material. The deactivation sequence calls for the coating with the coating material to end before coating with the solvent.

Preferably no significant intermixing of the solvent with the coating material takes place. In the boundary layer the coating material is evaporated at most more rapidly by the solvent. The intermixing of the coating material with the coating inhibitor, especially solvent, is to be so small as claimed in the invention that the zone which is not to be coated is not coated with the coating material. After a successful coating of the central region (especially inner circular ring surface) the condition can be tested afterwards by a measurement method, preferably by a contact angle measurement device. Advantageously the contact angle in the area not to be coated according to the process as claimed in the invention has been changed at most by 15°, more preferably at most by 10°, still more preferably at most by 5°, most preferably by 0°.

The separate process step of removal of the material, which step was used in the past, on the wafer edge as claimed in the invention is converted into a process of flushing of the edge which proceeds especially at the same time with the coating in order to inhibit the coating by a coating material or preferably to completely prevent it. The especially blanket application of the adhesive is not a critical component of the method or device as claimed in the invention, but can be implemented in them.

According to one advantageous embodiment it is provided that the first application means is arranged or can be arranged such that the application of the coating material takes place in the region of the rotation axis R of rotation, especially concentrically to the carrier wafer. In this way a homogenous distribution of the coating material on the entire coating surface is enabled since the distribution of the coating material takes place extremely uniformly especially at a constant rotational speed along the coating surface. The carrier wafer is rotated by accommodating and fixing of the carrier wafer on a rotatable receiver, especially a chuck, the accommodating and fixing of the carrier wafer taking place in an alignment as exactly concentric as possible to the axis of rotation of the receiving apparatus.

Because the second application means is arranged or can be arranged such that the application of the coating inhibitor takes place especially on one peripheral section of the outer circular ring surface 1*a* in the region of a radially inner edge of the outer circular ring surface, the principle of distribution of the coating inhibitor by rotation of the carrier wafer can also be used here so that an at least largely simultaneous application of the coating inhibitor with the coating material is conceivable as claimed in the invention. Only the application site on the coating surface differs, the application of the solvent to the carrier wafer taking place farther away from the axis R of rotation than the application of the coating material.

Here it is advantageous if there are control means as claimed in the invention for controlling an application amount and/or an application pressure and/or an application instant and/or an application speed and/or an application angle and/or an application point and/or an application position of the first and/or second application means. If these parameters are made to be adjustable, the device as claimed in the invention and the method as claimed in the invention can be set to different combinations of coating materials and corresponding coating inhibitors. With greater application of the amount of coating inhibitors on the one hand the coating material is more effectively detached or dissolved, or that the coating material is more strongly hindered by the coating inhibitor from coating or covering the outer edge zone, on the other hand more coating inhibitor is consumed. By increasing the application pressure or the application speed or by choosing a skillful application angle the discharge of the coating inhibitor and coating agent can be optimized especially without increasing the application amount.

To the extent there are curing agents for curing of the coating material, the single-stage or two-stage process as claimed in the invention is further optimized since the curing of the coating material can take place especially at the same time with the distribution of the coating material on the coating surface. In conjunction with the ASL materials the monomolecular or multimolecular layer is understood during curing. In one embodiment as claimed in the invention these layers are formed by segregation effects on the surface. "Curing" below means the formation of a nonadhesive layer.

According to another advantageous embodiment of the invention, it is provided that the second application means have at least one line which can be arranged pointing with one outlet end toward the outer circular ring surface. Thus a directed jet and controlled application of the coating inhibitor in regions of the coating surface are possible, where the coating material in the distribution of the coating material is to be specially dissolved, or in general is to be kept away so that it does not cure there ("Curing"—see above).

Here it is especially advantageous if the second application means, especially on each outlet end, have an especially controllable nozzle. The inner nozzle typically has an opening diameter of 0.125 inch, the outer nozzle typically an opening diameter of 0.25 inch. Nozzles with smaller or larger opening diameters are also conceivable. The opening diameters are greater than 0.001 inch, preferably greater than 0.01 inch, more preferably greater than 0.1 inch, especially smaller than 1 inch. By this measure the device as claimed in the invention can be set not only to different coating material and solvent combinations, but also can be set to different sizes of the carrier wafer or the desired ratio of the size of the adhesion zone to the antiadhesion zone.

To the extent features which are disclosed according to the device also imply method features, they should also be considered as disclosed according to the method and vice versa.

Other advantages, features and embodiments of the invention are disclosed below.

BRIEF DESCRIPTION OF THE DRAWINGS

The same or equivalent components in the figures are labeled with the same reference numbers.

DETAILED DESCRIPTION OF THE INVENTION

Figure 1:
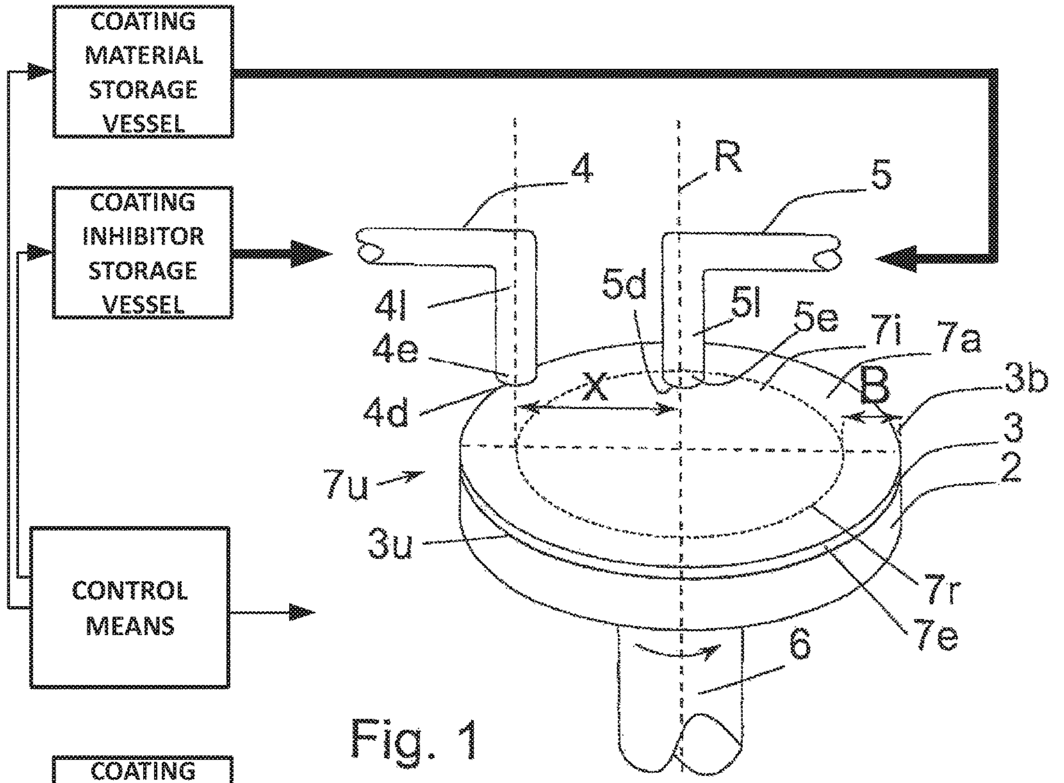
FIG. 1 shows a perspective view of one embodiment of the device according to the present invention before application of the coating material.
Figure 2:
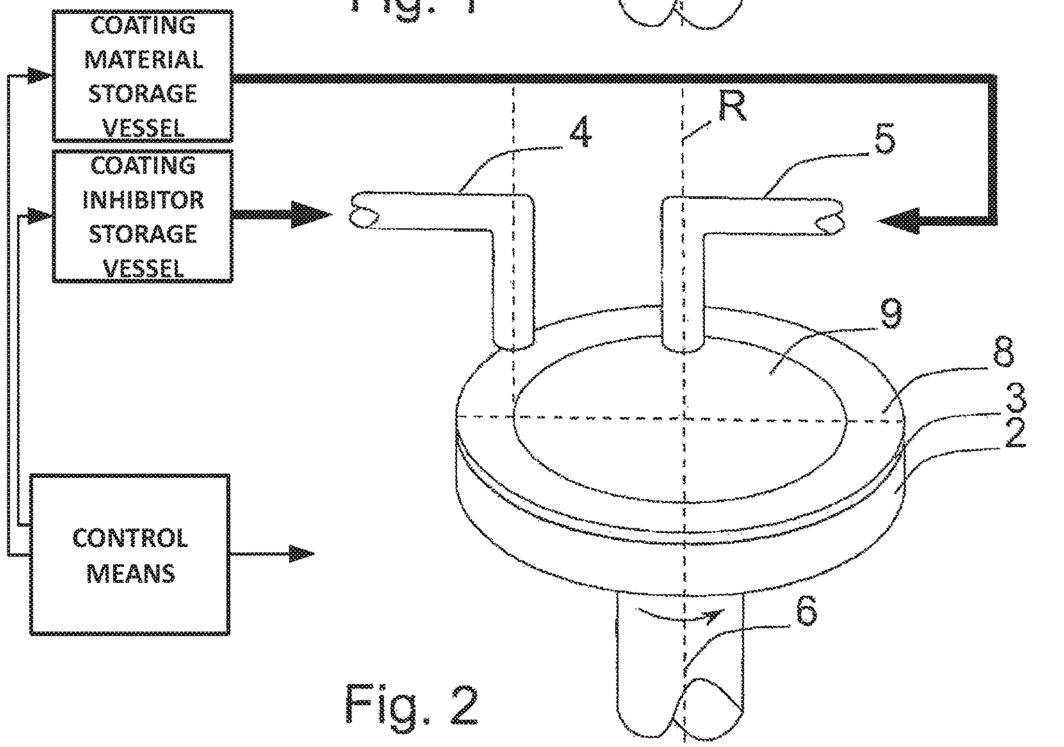
FIG. 2 shows one embodiment according to FIG. 1 after implementing the two-step process according to the present invention.

The illustrated embodiment of the device according to the present invention for coating of an inner circular surface 7*i* of a coating surface 3*b* of a carrier wafer 3 with a coating material 9 is shown only schematically in the figures and is reduced to the components important for the description of the invention. Thus the figures lack a rack for holding the illustrated components as well as a control apparatus of the present invention for controlling the components according to the present invention which are described below.

The carrier wafer 3 is received and fixed on a receiver 2 (for example a chuck) on its bottom 3*u* facing away from the coating surface 3*b* after the carrier wafer 3 has been aligned relative to one axis R of rotation. The axis R of rotation is located at the center (center of rotational symmetry) of the carrier wafer 3. The rotation takes place by a rotating shaft 6 which is driven by driving means which are not shown (controlled by the control apparatus). The receiver 2 and the rotating shaft 6 as well as the control apparatus jointly form the rotation means.

Above the coating surface 3*b* there are or can be first application means 5 in the form of a line 5*l*, the first application means 5 being arranged fixed or fixable to the axis R of rotation. In the illustrated embodiment the line 5*l* on its outlet end Se is provided with a nozzle 5*d* and points in the direction of the center of the carrier wafer 3 (intersection of the axis R of rotation and the coating surface 3*b*).

The line 5*l* is connected to a storage vessel for the coating material 9 and the delivery of the coating material 9 from the storage vessel to the nozzle 5*d* and the application to the coating surface 3*b* take place via a pump (not shown) which is triggered by the control apparatus. The aforementioned features form the first application means 5. The coating material 9 need not be applied by a pump, but can be applied by an elevated tank, simply by the action of gravity. Furthermore an application of the liquid with increased pressure or increased speed is conceivable. It is clear to one skilled in the art in the field that application of the coating material is all that matters.

The first application means 5 applies the coating material 9 to the inner circular surface 7*i*, especially at the intersection of the inner circular surface 7*i* with the axis R of rotation (center of the carrier wafer 3), especially accelerated by the rotation of the rotation means around the axis R of rotation, distributed on the inner circular surface 7*i*.

It can be easily imagined that by the rotation and the centrifugal force generated thereby on the coating surface 3*b* of the coating material 9 delivery takes place from the center of the carrier wafer 3 radially and concentrically to the outside until it leaves the inner circular surface 7*i* and enters an outer circular ring surface 7*a*. The friction of the coating surface 3*b* with the coating material 9 also accelerates the coating material in the direction of rotation of the rotating means so that the coating material is accelerated on an arc-shaped path from the center of the carrier wafer 3*b* to the peripheral edge 7*e*. Continued rotation conveys the coating material 9 furthermore essentially radially to the outside to one peripheral edge 7*e* where the coating material leaves the carrier wafer 3 and is captured by a capture apparatus which is not shown.

During the movement of the coating material 9 along the coating surface 5*b* the coating material 9 is cured by curing agents (curing—see above) so that a homogenous layer of the coating material 9 would form on the entire coating surface 3*b* without further measures.

Second application means 4 for applying a solvent as coating inhibitor which can dissolve the coating material 9 to an outer circular ring surface 7*a* which surrounds the inner circular surface 7*i* are located or can be located in the illustrated exemplary embodiment above the carrier wafer 3. Advantageously the application means or the application site of the coating surface 3*b* of the second application means 4 can be set by alignment means, especially by adjusting the application means 4 parallel to the coating surface 3*b*.

The application by the second application means 4 takes place relative to the application by the first application means 5 farther away from the center of the carrier wafer 3.

The structure of the second application means 4 can be analogous to the first application means 5, especially with a line 41, one outlet end 4*e* and one nozzle 4*d* as well as a storage vessel for the solvent, and a pump (controlled by the control apparatus).

The solvent is applied by the second application means 4 in the region of the peripheral section 7*u* so that the solvent is applied in the illustrated exemplary embodiment only at one site on the periphery. Only by rotation of the carrier wafer 3 by the rotating means is solvent fully applied to the outer circular ring surface 7*a* after one rotation of the carrier wafer.

The second application means 4 are arranged such that the solvent is applied on an inner edge 7*r* of the outer circular ring surface 7*a*, therefore toward the center of the carrier wafer 3. From there it is accelerated radially to the outside and in the direction of rotation analogously to the coating agent 9 so that the entire outer circular ring surface 7*a* is continuously supplied with solvent which dissolves the coating material 9 and/or prevents curing of the coating material 9 on the outer circular ring surface 7*a*, and/or separates the coating material 9 from the coating surface 3*b* by its providing for the coating material 9 being spun off beyond the coating inhibitor.

Thus, after application of a defined application amount of the coating agent 9 by the first application means 5 a cured part of the coating agent 9 remains on the inner circular surface 7*i* as a homogeneous antiadhesion layer, while the curing of the coating agent 9 in the outer circular surface 7*a* is prevented or at least inhibited by the solvent.

Consequently, by simultaneous application of coating material 9 and coating inhibitor a carrier wafer 3 which is coated only in the inner circular surface 7*i* with coating material 9 (antiadhesion layer) is formed in a single-stage process.

In a second step, especially in the device according to the present invention, an adhesive layer can be applied to the outer circular ring surface 7*a*, especially the entire coating surface 3*b* (therefore also to the coating material 9 in the inner circular surface 7*i*). For this purpose either the first and/or the second application means 4, 5 or separate third application means (not shown) can be used.

Furthermore, according to the present invention there can be fourth application means for cleaning the carrier wafer 3 after coating.

A radius X of the inner circular surface 7*i* is defined by the distance of the application site of the coating inhibitor from the axis R of rotation on the coating surface 3*b*. The ring width B of the outer circular ring surface 7*a* is also defined automatically by this. The ring width B is smaller than 10 mm, preferably smaller than 5 mm, more preferably smaller than 2 mm, most preferably smaller than 1 mm. The application of the solvent as a directed jet, especially flat jet, can take place due to the shape of the nozzle 4*d* so that the inner edge 7*r* is delineated as clearly as possible and runs concentrically to the carrier wafer 3.

In one advantageous embodiment of the invention, distributed on the periphery there can be several lines 4*l* for applying solvents on several peripheral sections 7*u*. In one advantageous embodiment the application angle (in the illustrated exemplary embodiment parallel to the axis of rotation) can be angled such that the nozzle 4*d* is located tilted obliquely to the outside. This measure prevents the coating inhibitors from striking the inner circular surface 7*i*.

REFERENCE NUMBER LIST

2 receiver
3 carrier wafer

3*b* coating surface
3*u* bottom
4*l* line
4*d* nozzle
4*e* outlet end
5 first application means
5*l* line
5*d* nozzle
5*e* outlet end
6 rotating shaft
7*a* outer circular ring surface
7*i* inner circular surface
7*e* peripheral edge
7*r* inner edge
7*u* peripheral section
8 adhesive
9 coating agent
R axis of rotation
X radius/distance
B ring width Having described the invention, the following is claimed:

1. A device for coating a surface of a carrier wafer, said device comprising:

a receiver for receiving a carrier wafer having a coating surface that includes (i) an inner circular surface and (ii) a peripheral outer circular ring surface extending to a peripheral edge of the carrier wafer and surrounding the inner circular surface, said receiver rotatable about an axis of rotation, a coating material comprising an anti-adhesion material that prevents or reduces adhesion to the coating surface of the carrier wafer, a first storage vessel containing the coating material that comprises the anti-adhesion material, a coating inhibitor that separates the coating material from the coating surface of the carrier wafer by causing the coating material to move over the coating inhibitor, a second storage vessel containing the coating inhibitor that separates the coating material from the coating surface of the carrier wafer, a first application means including a first line and a first nozzle, wherein said first line receives the coating material contained in the first storage vessel and delivers the coating material to the first nozzle, said first nozzle configured to apply the coating material to the inner circular surface to coat the inner circular surface with the coating material, wherein rotation of the receiver distributes the coating material on the coating surface of the carrier wafer by generating a centrifugal force, said coating material distributed on the coating surface radially and concentrically from a center of the carrier wafer at the inner circular surface to the peripheral outer circular ring surface, a second application means including a second line and a second nozzle, wherein said second line receives the coating inhibitor contained in the second storage vessel and delivers the coating inhibitor to the second nozzle, said second nozzle configured to apply the coating inhibitor to the peripheral outer circular ring surface, and a control means configured to control the rotation of the receiver and operation of the first and second application means such that the second application means applies the coating inhibitor to the peripheral outer circular ring surface prior to or simultaneously with the first application means applying the coating material to the inner circular surface, thereby inhibiting coating of the peripheral outer circular ring surface with the coating material by causing the coating material distributed to the peripheral outer circular ring surface by the centrifugal force to move over the coating inhibitor.

2. The device as claimed in claim 1, wherein the first application means is arranged such that the coating material is applied by the first application means to the inner circular surface in a region of the axis of rotation.

3. The device as claimed in claim 1, wherein the second application means is arranged such that the coating inhibitor is applied by the second application means to a peripheral section of the peripheral outer circular ring surface in a region of a radially inside edge of the peripheral outer circular ring surface.

4. The device as claimed in claim 1, wherein the control means is configured to control at least one of: application amounts; application pressure; application speed; application angles; or application instants of at least one of the first or second application means.

5. The device as claimed in claim 1, wherein the coating material is cured by curing agents.

* * * * *